United States Patent [19]
Gal-Or et al.

[11] Patent Number: 6,127,283
[45] Date of Patent: Oct. 3, 2000

[54] METHOD OF ELECTROPHORETIC DEPOSITION OF FERROELECTRIC FILMS USING A TRIFUNCTIONAL ADDITIVE AND COMPOSITIONS FOR EFFECTING SAME

[75] Inventors: Leah Gal-Or, Itaifa; Rony Goldner, Mizpe Adi; Nina Sezin, Haifi; Ala Pismany, Haifi; David Brandon, Haifa, all of Israel

[73] Assignee: Cerel (Ceramic Technologies) Ltd., Nesher, Israel

[21] Appl. No.: 09/432,205

[22] Filed: Nov. 2, 1999

[51] Int. Cl.$^7$ .................................................. C25D 13/02
[52] U.S. Cl. ...................... 438/785; 438/778; 428/688; 257/295; 204/490; 204/491
[58] Field of Search .................................. 438/778, 785; 428/688; 257/295; 204/490, 491

[56] References Cited

U.S. PATENT DOCUMENTS 5,462,647  10/1995  Bhattacharya et al. .

FOREIGN PATENT DOCUMENTS 127439  4/1995  Japan .

OTHER PUBLICATIONS

Sweeney et al. "Electrophoretic Deposition of Ferroelectric Thin Films", Ferroelectrics, 197: 57–73, 1996.
Scott, JF, "The Physics of Ferroelectric Ceramic Thin Films for Memory Applications", Ferroelectric Review, 1(1): 107–119, 1998.
Laubersheimer et al, "Electrophoretic Deposition of Sol–Gel Ceramic Microcomponents Using UV–Curable Alkoxide Precursors", J. European Ceramic Soc., 18: 255–260, 1998.
Nagai et al, "Electrophoretic Deposition of Ferroelectric Barium Titanate Thick Films and their Dielectric Properties", J. of Am. Ceramic Soc., 76: 253–255, 1993.
Sweeney et al, "Electrophoretic Deposition of Ferroelectric Thin Films", Ferroelectrics, 187: 57–73, 1996.

Primary Examiner—Charles Bowers
Assistant Examiner—Lisa Kilday
Attorney, Agent, or Firm—Mark M. Friedman

[57] ABSTRACT

An improved method for depositing ferroelectric particles on a surface of a substrate to form films or stand-alone bodies. The improvement is based on electrophoretic deposition (EPD) of ferroelectric films by using a tri-functional phosphate ester additive having a concentration less than 10 volume percent in the EPD suspension, without the need for addition of a binder. The method includes preparation of the suspension by washing and dispersing ferroelectric particles, for example, commercially available PZT powder, in a polar solvent such as ethanol, followed by addition of the phosphate ester additive to the suspension, and an ultrasound treatment. The suspension is used in EPD of the ferroelectric particles on a prepared substrate. Following EPD, the green film is dried and sintered at high temperature. Visual and physical examination of stand alone and patterned PZT deposited films show excellent quality obtained in manufacturing a diversity of piezoelectric products, featuring exceptionally high green film uniformity, thickness distribution, and reproducibility to within ±2 microns for 20 micrometer film thickness. The phosphate ester additive functions by improving stabilization and control of suspension characteristics and properties during the electrophoretic migration process, and by improving desired dimensions, characteristics, and electrical properties of the deposited green film. Thin or thick ferroelectric films, either as stand alone products, or formed on geometrically demanding patterned or non-patterned substrates are produced by using the method. The improved method is applicable to different ferroelectric particulate materials and to different substrates used for manufacturing piezoelectric elements and devices, in a cost effective manner.

25 Claims, 6 Drawing Sheets

(4 of 6 Drawing Sheet(s) Filed in Color)

METHOD OF ELECTROPHORETIC DEPOSITION OF FERROELECTRIC FILMS USING A TRIFUNCTIONAL ADDITIVE AND COMPOSITIONS FOR EFFECTING SAME

FIELD AND BACKGROUND OF THE INVENTION

The present invention relates to methods of manufacturing piezoelectric products used in the fields of electronics and electro-optics, by deposition of ferroelectric films and, more particularly, to an improved method for electrophoretic deposition (EPD) of ferroelectric films by using a tri-functional additive in EPD suspensions, compositions of suspensions for effecting same, and ferroelectric films formed therefrom.

Ferroelectric materials are used in many applications in electronics and electro-optics. Due to growing demand for miniaturization of electronic products, particularly for micro-electro-mechanical (MEM) devices or systems, there is a complementary growing need for miniaturized piezoelectric elements or piezoelectric films, of thickness on the order of less than 100 microns. Production of thin and thick piezoelectric films, where, in general, thin and thick films are of thickness of less than about 2 microns and greater than about 2 microns, respectively, started in the 1980's. Piezoelectric films are applied in the production of high dot per inch (DPI) ink jet printing nozzle arrays for printing heads, and for functional devices possessing specific electrical, mechanical, and piezoelectric properties or characteristics, such as solid state devices including actuators, micro-machinery, ultrasound transducers, pyroelectric sensors, electro-optic displays, ferroelectric field-effect transistors, high value capacitors, non-volatile memory field-effect transistors, infrared sensors, and optical switches.

It will be appreciated that application of piezoelectric films is an important basis for next century's electronic and electro-optic devices.

Several methods are currently used for manufacturing piezoelectric films and elements by deposition, varying greatly both with respect to methodology and with respect to obtained results. These methods include physical vapor deposition (PVD) such as sputtering, laser ablation and evaporation or molecular beam epitaxy (MBE), chemical vapor deposition (CVD) methods such as metal-organic chemical vapor deposition (MOCVD) and plasma enhanced chemical vapor deposition (PECVD), and wet chemistry methods such as sol-gel processing, electrophoretic deposition, liquid phase epitaxy, tape casting, and slip casting.

Each of these methods has advantages and disadvantages. PVD and CVD deposition methods ordinarily require sophisticated and expensive equipment, making them either undesirable or impracticable for implementation in manufacturing environments. PVD methods involving vacuum techniques have the advantage of being based on dry processes featured by high levels of system purity and cleanliness, translating to relatively high compatibility with fabrication of semiconductor integrated circuits. However, sputtering and MOCVD deposition methods are limited by difficulties in controlling component stoichiometry, especially in multi-component systems, and deposition rates are low. In these methods, there is also a need for post deposition annealing due to occurrence of internal stresses. The technique of laser ablation may be quick for producing films of usable quality, but yields poor thickness uniformity for deposition areas larger than about 1 cm$^2$, and is limited by particulate ejection from the target, thereby causing defects in the deposited ferroelectric film.

Simpler and less expensive ferroelectric deposition methods include sol-gel processing, tape casting, slip casting, and electrophoretic deposition (EPD). Sol-gel processing techniques combine the advantages of high compositional control, thin coating capability, and low equipment costs, but sol-gel processing techniques are limited by the occurrence of large volume changes during the deposition process. Sol-gel techniques are useful for thin film production, but are relatively slow for producing thick films having thickness larger than about 1 micron because multiple deposition is required. Tape casting and slip casting are part of wet methods of film deposition, and are used for conventional production of piezoelectric elements of thicknesses of tens to several hundreds of microns, and are not thin film technologies.

Electrophoretic deposition (EPD), a relatively new ferroelectric materials processing technique, in which charged ferroelectric particles, typically submicron in size, dispersed or suspended in a liquid medium are attracted and deposited onto a substrate acting as an electrode of opposite charge, during application of an electric field through the liquid, has been successfully applied to the production of thin, less than 2 microns, and thick, greater than 2 microns, ferroelectric films and elements for the manufacture of piezoelectric devices. Commonly used ferroelectric materials are of the perovskite type, such as lead-zirconate-titanate, $PbZrTiO_3$ (PZT), lead titanate, $PbTiO_3$ (PT), and barium titanate, $BaTiO_3$ (BT).

For better understanding and appreciation of the present invention, an EPD process may be considered to involve two principle stages. The first stage involves electrophoretic movement or migration of the ferroelectric particles through an EPD suspension, and the second stage involves deposition of the ferroelectric particles onto an electrode or treated substrate. Hereinafter, the term 'EPD suspension' or 'electrophoretic suspension' refers to the combination or suspension of an 'EPD liquid medium', and the ferroelectric particles, with or without addition of one or more liquid or solid phase additives and/or binders. Furthermore, hereinafter, an 'EPD liquid medium' refers to a pure solvent, or combination of two or more pure solvents, without addition of any liquid or solid phase additive and/or binder. Ferroelectric particles may be added to an EPD liquid medium either before or after addition of one or more liquid or solid phase additives and/or binders.

Effective electrophoretic deposition of ferroelectric materials is strongly dependent upon using a suitable EPD liquid medium which exhibits three important characteristics of rapidly and uniformly (i) dispersing the ferroelectric particles while preventing particle sedimentation and agglomeration, prior to and during the migration stage of the EPD process (ii) charging the ferroelectric particles, prior to and during the migration stage of the EPD process, and (iii) binding of the ferroelectric particles to the selected substrate and to each other, during the deposition stage of the EPD process. Exhibiting all three characteristics is critical for enabling the manufacture of piezoelectric elements or devices having suitable electrical and piezoelectric properties such as high dielectric constant, and other physicochemical properties such as uniform film thickness, and high film strength.

Commonly used EPD liquid media include pure, or mixtures of two or more miscible, polar organic solvents such as alcohols, ketones, aldehydes, providing strong ionization effects to the dispersed particles. Typically, ferroelectric particles are initially dispersed in a selected pure solvent, and if it is determined that there is insufficient dispersion, or particle charging, mixtures of varying concentration ratios of two or more solvents are then used for improved particle dispersion and/or charging in the EPD liquid medium. Concentration ratios of two solvents as EPD liquid media, for example, are usually in the range of about 90/10 to 10/90, volume/volume.

An example of electrophoretic deposition of PZT films is described in U.S. Pat. No. 5,462,647, issued to Bhattacharya et al., wherein PZT is dispersed in an aqueous dimethylsulfoxide (DMSO) solution. Electrophoretic deposition of PT and PZT films is described in Japanese Patent Application No. 127439, of Apr. 28, 1995, wherein either a PZT or a PT powder is dispersed in pure acetone.

In both teachings, a main objective is recovery of deposited PZT or PT in powdered form. Extensive elemental analysis was performed for characterizing composition of the recovered PZT or PT powders, but minimal attention was focused on optimization of deposition rate, or of other parameters important during the manufacture of piezoelectric devices, such as density, strength, and shrinkage of the deposited films, especially with respect to effect and influence of EPD suspension characteristics during the migration and deposition stages of the EPD process.

An example of electrophoretic deposition of ferroelectric BT thick films is that reported by Nagai et al., *Communications of the American Ceramic Society*, January 1993, in the Journal of Am. Ceram. Soc., 76, 1993. BT films 10–70 microns thick were formed from EPD suspensions featuring BT dispersed in a range of mixed ethanol-acetylacetone liquid media. It was observed that colloidal suspensions of BT powder were difficult to deposit from either ethanol or acetylacetone alone, however, upon adding acetylacetone to ethanol, BT films were successfully deposited onto the platinum cathode. The amount of BT deposit, measured as mg BT film per square centimeter of film area, increased with increasing concentration of acetylacetone in ethanol, became independent of the concentration ratio between 20 to 80 volume percent of acetylacetone/ethanol, and gradually decreased until from pure acetylacetone BT was again difficult to deposit. It was proposed that this solvent effect was due to the presence of free protons arising from the aldol reaction between acetylacetone and ethanol.

Addition of a liquid phase additive to the liquid medium of an EPD suspension, where an additive is defined as being of concentration less than 10 volume percent of the EPD suspension, has been done. Examples of additives include acetylacetone, nitric acetate and tartaric acid.

In addition to improving particle dispersion by using an EPD liquid medium including a second or third organic solvent, the main function of a much lower concentration additive in an EPD suspension is to enhance ferroelectric particle dispersion and stabilization of such a suspension via effecting conductivity, pH and viscosity, of the EPD suspension, while preventing particle sedimentation, thereby enhancing migration and deposition stages of the EPD process, ultimately leading to an improved piezoelectric element or device. Depending upon the electrochemistry and relative concentration of a specific additive in an EPD suspension, an additive may also perform a second function as a charging agent of the ferroelectric particles, thereby enhancing particle migration during the migration stage of the electrophoretic process and formation of a deposited film having improved dielectric and piezoelectric properties.

Ideally, an additive to an EPD suspension should function in three ways, thereby enhancing all three important characteristics needed for highly effective EPD of ferroelectric films, as described above, including rapid and uniform dispersion of the ferroelectric particles while preventing particle agglomeration, prior to and during the migration stage of the EPD process, charging the ferroelectric particles, and binding of the ferroelectric particles to the selected substrate and to each other, during the deposition stage of the EPD process.

Until now, however, there are teachings of only single or dual functioning additives used for EPD of ferroelectric particles, and no teaching of a tri-functional additive. Enhancement of ferroelectric particle binding characteristics of an EPD suspension is currently accomplished by addition of either a separate binder, or of a dispersing agent which also acts as a binding agent, to the EPD liquid medium or suspension.

In EPD of ferroelectric films, the function of a binder is to improve physical characteristics such as green film density and quality of the deposited film on an electrode or surface activated substrate, immediately following the stage of charged particle migration in the electrophoretic process. However, side effects due to the presence of a binder in an EPD suspension may not be synergetic with important desirable effects of enhancing dispersion and charging of the ferroelectric particles. In currently used EPD suspensions for EPD of ferroelectric films, there often exists a trade off between enhancing dispersion and charging of ferroelectric particles, and enhancing binding of the particles, according to the type and concentration of additives used in a given EPD suspension, and according to the physicochemical interaction between the one or more additives and the selected ferroelectric material.

Electrophoretic deposition of PZT was studied by Sweeney and Whatmore, *Ferroelectrics*, vol. 187, 57–73, 1996. Films of thickness of 10 microns were deposited from suspensions of PZT in acetone having less than 1 volume percent of nitric acid as an additive, and having less than 1 weight percent of nitrocellulose as a binder. It was determined that the presence of nitric acid additive significantly enhanced PZT particle dispersion and charging, leading to improved characteristics and properties of the deposited PZT films. They observed that the zeta potential of the suspended PZT particles increased with increasing nitric acid concentration in the range of 0.04 ppm to 400 ppm. High values of zeta potential are desirable, since migration velocity or electrophoretic mobility of the ferroelectric PZT particles is directly proportional to zeta potential of the particles in the EPD suspension. They proposed that the nitric acid additive promotes a reaction at the PZT particle surface causing an increase of the electrical charge of the PZT particles in suspension. In this particular case, nitric acid as additive also functions as a charging agent of the suspended PZT particles. In this particular case, nitric acid behaves as a dual functioning additive with respect to enhancing dispersion and charging characteristics of the suspended PZT articles.

As indicated above, the presence of a binder in a suspension of ferroelectric particles can cause undesirable effects during the migration stage of the electrophoretic process, such as a decrease in particle charge and particle migration velocity, translating to a decrease in rate of film deposition. This was confirmed by Sweeney and Whatmore, where they observed that the presence of the nitrocellulose binder had an extremely deleterious effect on the zeta potential of the suspended PZT particles. They proposed that this drop in zeta potential is caused by the nitrocellulose adsorbing onto the particle surface resulting in a significantly large reduction of the potential across the adsorbed surface layer. The overall net effect of using a separate nitrocellulose binder in addition to nitric acid additive in the EPD suspension was to improve binding characteristics of the PZT films, but at a cost of decreasing migration characteristics of the particles through the suspension.

To one of ordinary skill in the art, there is a clearly defined need for an improved method of electrophoretic deposition of ferroelectric films involving the use of a tri-functional additive in EPD suspensions, which eliminates the need for including a separate binder in the suspension, and simultaneously enhances desirable and necessary dispersing, charging, and binding characteristics of suspended ferroelectric particles, ultimately improving manufacture of piezoelectric products, devices, and elements, in a cost effective manner. There is also a clear need, and it would be highly advantageous to have improved compositions for effecting the same, and for having improved ferroelectric films and free-standing products obtained thereof.

SUMMARY OF THE INVENTION

The present invention relates to methods of manufacturing piezoelectric products, devices, and elements used in the fields of electronics and electro-optics, by deposition of ferroelectric films and, more particularly, to an improved method for electrophoretic deposition of ferroelectric films by using a tri-functional additive in EPD suspensions, compositions of suspensions for effecting same, and ferroelectric films formed therefrom.

It is therefore an object of the present invention to provide an improved method for electrophoretic deposition of ferroelectric films by using a tri-functional additive.

It is a further object of the present invention to provide an improved method for EPD of ferroelectric films by using a tri-functional additive in the electrophoresis suspension of ferroelectric particles which precludes the need for addition of a separate binder to an EPD suspension.

It is still a further object of the present invention to provide an improved method for EPD of ferroelectric films by using a tri-functional additive in the electrophoresis suspension which simultaneously enhances dispersion, electrostatic charging, and binding of the suspended ferroelectric particles without the need for addition of a binder to the electrophoresis suspension, leading to improved electrophoresis migration and deposition behavior of the particles.

It is still a further object of the present invention to provide an improved method for EPD of ferroelectric films by using a tri-functional additive in the electrophoresis suspension which improves the piezoelectric properties and characteristics of the deposited ferroelectric films.

It is still a further object of the present invention to provide an improved method for EPD of ferroelectric films by using a tri-functional additive in the electrophoresis suspension that is applicable to different ferroelectric particulate materials and to different substrates used for manufacturing piezoelectric elements or devices, in a cost effective manner.

It is another object of the present invention to provide improved compositions of suspensions for EPD of PZT ferroelectric films by including in the compositions a tri-functional additive, whereby the improved compositions enable achieving each of the above described objects.

It is a further object of the present invention to provide an improved ferroelectric film formed by electrophoretically depositing ferroelectric particles on a surface of a substrate, from a suspension including ferroelectric particles, a polar solvent, and a phosphate ester additive.

It is a further object of the present invention to provide an improved method for EPD of ferroelectric films by including in the compositions of the suspensions a tri-functional additive, whereby the improved compositions enable forming both stand alone or coated products, devices, and elements.

Thus, according to one aspect of the present invention there is provided an improvement to a method of depositing ferroelectric particles on a surface of a substrate, featuring the steps of (a) preparing a suspension of the ferroelectric particles; and (b) electrophoretically depositing the ferroelectric particles on a surface of the substrate, for forming a green film coating on the surface of the substrate, the improvement comprising the step of (c) during the step of preparing the suspension of the ferroelectric particles, adding to the suspension a phosphate ester additive having a concentration less than 10 volume percent in the suspension.

According to further features in preferred embodiments of the invention described below, the phosphate ester additive is soluble in a polar solvent.

According to further features in preferred embodiments of the invention described below, the addition of the phosphate ester additive to the suspension of the ferroelectric particles causes a decrease in pH of the suspension.

According to further features in preferred embodiments of the invention described below, the addition of the phosphate ester additive to the suspension of the ferroelectric particles causes an increase in conductivity of the suspension of the ferroelectric particles.

According to further features in preferred embodiments of the invention described below, the addition of the phosphate ester additive to the suspension of the ferroelectric particles causes a decrease in pH of the suspension and an increase in conductivity of the suspension.

According to further features in preferred embodiments of the invention described below, the addition of the phosphate ester additive to the suspension of the ferroelectric particles above an empirically determined concentration of the phosphate ester additive in the suspension, pH of the suspension remains approximately constant.

According to further features in preferred embodiments of the invention described below, the addition of the phosphate ester additive to the suspension of the ferroelectric particles above an empirically determined concentration of the phosphate ester additive in the suspension, pH of the suspension remains approximately constant and conductivity of the suspension increases.

According to another aspect of the present invention there is provided a method of depositing ferroelectric particles on a surface of a substrate, the method comprising the steps of (a) preparing a suspension of the ferroelectric particles, the suspension of the ferroelectric particles including a phosphate ester additive having a concentration less than 10 volume percent in the suspension; and (b) electrophoretically depositing the ferroelectric particles on the surface of the substrate, for forming a green film coating on the surface of the substrate.

According to further features in preferred embodiments of the invention described below, the phosphate ester additive is soluble in a polar solvent, the polar solvent includes an alcohol, the alcohol includes ethanol.

According to further features in preferred embodiments of the invention described below, the addition of the phosphate ester additive to the suspension of the ferroelectric particles causes a decrease in pH of the suspension.

According to further features in preferred embodiments of the invention described below, the addition of the phosphate ester additive to the suspension of the ferroelectric particles causes an increase in conductivity of the suspension.

According to further features in preferred embodiments of the invention described below, the addition of the phosphate ester additive to the suspension of the ferroelectric particles causes a decrease in pH of the suspension and an increase in conductivity of the suspension.

According to further features in preferred embodiments of the invention described below, the addition of the phosphate ester additive to the suspension of the ferroelectric particles above an empirically determined concentration of the phosphate ester additive in the suspension, pH of the suspension remains approximately constant.

According to further features in preferred embodiments of the invention described below, the addition of the phosphate ester additive to the suspension of the ferroelectric particles above an empirically determined concentration of the phosphate ester additive in the suspension, pH of the suspension remains approximately constant and conductivity of the suspension increases.

According to further features in preferred embodiments of the invention described below, the green film on the surface of the substrate is selected from the group consisting of stand alone product, patterned films, and non-patterned films.

According to further features in preferred embodiments of the invention described below, the green film has a thickness uniformity to within about ±2 microns.

According to further features in preferred embodiments of the invention described below, the method further comprises the steps of: (c) preparing the surface of the substrate for electrophoretic deposition of the ferroelectric particles according to manufacturing a piezoelectric product selected from the group consisting of stand alone, pattern coated, and non-pattern coated; and (d) thermally processing the green film on the surface of the substrate according to the green film selected from the group consisting of the stand alone product and the coated product.

According to further features in preferred embodiments of the invention described below, the step of thermally processing the green film according to the stand alone product, the green film formed on the surface of the substrate featuring a mandrel for holding the green film, further comprises the step of: (i) heating and separating the green film from the surface of the mandrel featuring a consumable material, thereby forming the stand alone product.

According to further features in preferred embodiments of the invention described below, the step of thermally processing the green film according to the stand alone product, the green film formed on the surface of the substrate featuring a multi-component fixture for holding the green film, further comprises the steps of: (i) separating the green film held by a second component of the multi-component fixture from a first component of the multi-component fixture, the second component featuring a consumable material; and (ii) heating and separating the separated green film from the surface of the second component, thereby forming the stand alone product.

According to yet another aspect of the present invention there is provided a suspension comprising (a) ferroelectric particles; (b) a polar solvent; and (c) a phosphate ester additive having a concentration less than 10 volume percent in the suspension.

According to further features in preferred embodiments of the invention described below, the phosphate ester additive is obtained by reacting phosphoric acid with two different long-chained alcohols.

According to further features in preferred embodiments of the invention described below, the phosphate ester additive is soluble in the polar solvent.

According to further features in preferred embodiments of the invention described below, the addition of the phosphate ester additive to the suspension of the ferroelectric particles causes a decrease in pH of the suspension.

According to further features in preferred embodiments of the invention described below, the addition of the phosphate ester additive to the suspension of the ferroelectric particles causes an increase in conductivity of the suspension.

According to further features in preferred embodiments of the invention described below, the addition of the phosphate ester additive to the suspension of the ferroelectric particles causes a decrease in pH of the suspension and an increase in conductivity of the suspension.

According to further features in preferred embodiments of the invention described below, the addition of the phosphate ester additive to the suspension of the ferroelectric particles above an empirically determined concentration of the phosphate ester additive in the suspension, pH of the suspension remains approximately constant.

According to further features in preferred embodiments of the invention described below, the addition of the phosphate ester additive to the suspension of the ferroelectric particles above an empirically determined concentration of the phosphate ester additive in the suspension, pH of the suspension remains approximately constant and conductivity of the suspension increases.

According to still another aspect of the present invention there is provided a ferroelectric film formed by electrophoretically depositing ferroelectric particles on a surface of a substrate, from a suspension including ferroelectric particles, a polar solvent, and a phosphate ester additive having a concentration less than 10 volume percent in the suspension.

According to further features in preferred embodiments of the invention described below, the concentration of the phosphate ester additive is selected from the group consisting of less than seven volume percent, less than three volume percent, and less than one volume percent, in the suspension.

According to still further features in the described preferred embodiments the phosphate ester additive functions as a dispersing agent, an electrostatic charging agent, and a binding agent in the suspension of the ferroelectric particles.

According to still further features in the described preferred embodiments the phosphate ester additive is obtained by reacting phosphoric acid with two different long-chained alcohols, each of the two different long-chained alcohols being 10–15 carbon atoms long.

According to still further features in the described preferred embodiments the phosphate ester additive is soluble in a polar solvent, such as an alcohol, e.g., ethanol.

According to still further features in the described preferred embodiments addition of the phosphate ester additive to the suspension of the ferroelectric particles causes a decrease in pH of the suspension.

According to still further features in the described preferred embodiments addition of the phosphate ester additive to the suspension of the ferroelectric particles causes an increase in conductivity of the suspension of the ferroelectric particles.

According to still further features in the described preferred embodiments addition of the phosphate ester additive to the suspension of the ferroelectric particles causes a decrease in pH of the suspension and an increase in conductivity of the suspension.

According to still further features in the described preferred embodiments for addition of the phosphate ester additive to the suspension of the ferroelectric particles above an empirically determined concentration of the phosphate ester additive in the suspension, pH of the suspension remains approximately constant.

According to still further features in the described preferred embodiments for addition of the phosphate ester additive to the suspension of the ferroelectric particles above an empirically determined concentration of the phosphate ester additive in the suspension, pH of the suspension remains approximately constant and conductivity of the suspension increases.

According to still further features in the described preferred embodiments the green film on the surface of the substrate is selected from the group consisting of a stand alone structure, a patterned structure, and a non-patterned structure.

According to still further features in the described preferred embodiments the green film has a thickness uniformity to within about ±2 microns.

According to still further features in the described preferred embodiments the ferroelectric film has a film thickness larger than about 0.2 micron.

According to still further features in the described preferred embodiments the average particle size of the ferroelectric particles is less than about 1 micron.

The improved method for depositing ferroelectric particles on a surface of a substrate features electrophoretic deposition of ferroelectric films by using a tri-functional phosphate ester additive having a concentration less than 10 volume percent in the electrophoretic suspension. Moreover, the improved method of the present invention features improved compositions of suspensions for effecting EPD of ferroelectric films, and forming ferroelectric films therefrom. The improved method of the present invention serves as a significant improvement over currently used methods of EPD of ferroelectric films by eliminating the need for including a binder in suspensions of particulate ferroelectric materials, and simultaneously enhancing desirable and necessary dispersing, charging, and binding characteristics of suspended ferroelectric particles, ultimately improving manufacture of piezoelectric products, devices, and elements, in a cost effective manner.

BRIEF DESCRIPTION OF THE DRAWINGS

The file of this patent contains of least one paragraph executed in color.

The invention is herein described, by way of example only, with reference to the accompanying drawings, wherein.

DESCRIPTION OF THE PREFERRED EMBODIMENTS

Figure 1:
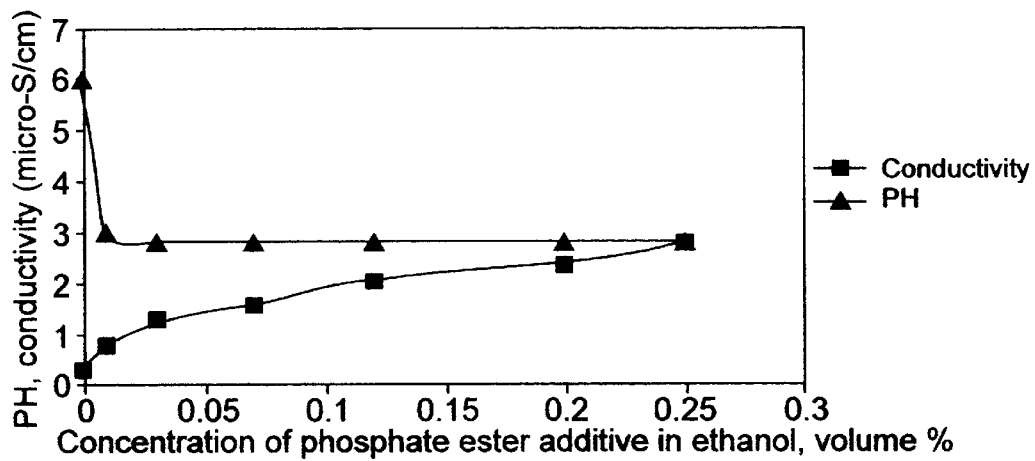
FIG. 1 is an illustration of a plot of the variation of conductivity and pH of the pure ethanol EPD liquid medium as a function of the phosphate ester additive concentration, in accordance with the present invention.

The present invention is of an improved method for electrophoretic deposition of ferroelectric films by featuring for the first time the use of a low concentration tri-functional phosphate ester additive in an EPD suspension of ferroelectric particles. Provided in the invention are also compositions of suspensions for effecting same, and ferroelectric films formed therefrom.

It was unexpectedly, yet advantageously, observed that the phosphate ester additive is tri-functional, in that as an additive by being present in very low concentration in the EPD suspension during the electrophoretic migration process, it functions in three ways by simultaneously enhancing dispersing, charging, and binding characteristics of ferroelectric particles during the migration and deposition stages of the EPD process. Improving the electrophoretic migration process includes increasing dispersion and electrostatic charging of the ferroelectric particles, translating to increasing rates of particle migration through he liquid medium, consequently increasing rates of film deposition. Improving the properties and characteristics of the deposited ferroelectric film include increasing film density and uniformity, along with increasing dielectric and piezoelectric properties, critical features required for manufacturing high quality piezoelectric products, devices, and elements.

The improved method for electrophoretic deposition of ferroelectric films by using a low concentration tri-functional phosphate ester additive in an EPD suspension of ferroelectric particles of the present invention is applicable to different ferroelectric particulate materials, such as perovskite type compositions of PZT, PT, and BT, and to different substrates, for example, metals, silicon, gallium arsenide, metallized ceramics, and glasses, with or without a specific pattern according to the desired application, such as conducting lines and element arrays, used for manufacturing piezoelectric products and devices, such as imaging and therapeutic ultrasound probes.

The method of the present invention is applicable to manufacturing a wide variety of piezoelectric objects, including piezoelectric oriented films, stand alone products, porous films and bodies, layered structures having a porosity distribution, and solid state devices such as actuators, transducers, and micro-machinery. Linear or two dimensional, films, e.g., in the several microns range, as well as thick films of up to 250 microns thick, and free-standing bodies several mm thick, can be produced by implementing the improved EPD method according to the present invention.

It is to be understood that the invention is not limited in its application to the details of construction, arrangement, and composition of the components set forth in the following description, drawings, or examples. For example, the following description refers to the widely used ferroelectric material PZT, in order to illustrate implementation of the present invention. The invention is capable of other embodiments or of being practiced or carried out in various ways. Also, it is to be understood that the phraseology and terminology employed herein is for the purpose of description and should not be regarded as limiting.

Steps, implementation, and principles of operation of an improved method of EPD of ferroelectric films by using a tri-functional additive according to the present invention are better understood with reference to the accompanying descriptions, drawings, and examples.

In step 1 of the improved method, there is preparation and treatment of a substrate surface for selective deposition of ferroelectric particles, for example, PZT particles, onto an object featuring the substrate surface. For the case of manufacturing a coated product, patterned or non-patterned, the substrate surface is activated, where the surface substrate is either patterned or non-patterned. For the case of manufacturing a stand alone product, there is preparation and treatment of either a mandrel or a multi-component fixture, serving as a temporary substrate, around which the stand alone structure or coat is to be formed by deposition.

A mandrel of consumable material, for example, graphite, may be used as a temporary substrate. A thermally consumable mandrel such as graphite is readily separated from the EPD film following the deposition process, enabling production of a stand alone piezoelectric product, device, or element. Alternatively, a multi-component fixture, for example, featuring one component such as a disk, covered with a second component such as fibrous material, is specifically designed for temporarily holding a stand alone product formed during the deposition process. For the deposition process, the fixture second component covering material, for example, fibrous material, is removed from the substrate along with the EPD deposit, followed by separation of the EPD deposit from the fibrous material, thereby enabling production of the stand alone piezoelectric product or element.

In order to form a ferroelectric PZT film, one of two substrate treatment procedures is applied, depending upon the substrate being non-conductive or conductive. In the first procedure involving a non-conductive substrate, the non-conductive substrate is covered with a selectively deposited electrically conductive layer. In the second procedure involving a conductive substrate, the conductive substrate is covered with a selectively deposited photoresist that is insoluble in organic media. Substrate material can be a metal, preferably a noble metal such as platinum, palladium, or gold, but, here, two factors need to be considered: (a) compatibility between thermal expansion coefficients of the substrate and the ferroelectric material, e.g., PZT, and (b) lack of inter-diffusion between the substrate and the ferroelectric material at elevated temperatures so as not to affect final properties of the obtained material. Other possible substrates include ceramic and semiconductor materials. Non-noble metals such as stainless steel can be used provided measures are taken to prevent their oxidation during the post deposition sintering stage.

In step 2, a commercial photolithography process is performed to obtain formation of a desired pattern, if applicable, using an appropriate mask material that is insoluble in the EPD suspension solvent. This step is relevant for formation of a coating, during manufacture of a coated product, and for performing the next step.

In step 3, there is application of the desired electrode, for example, conducting lines or patterns, made of conductive metal, by a technique of chemical plating, EPD, electrolytic plating or other related technique. The main criterion for selecting electrode material for use in an EPD cell is high corrosion resistance in the EPD solution, where the corrosion resistance is independent of pH change during the electrophoretic process.

In step 4, there is preparation of a suspension including ferroelectric particles, for example, commercially available PZT powder such as, but not limited to, Hizirco-L, 0.5 micron average particle size (manufactured by Hayashi Chemicals, Japan) by dispersing the ferroelectric particles in a polar solvent. Preferred concentration range of the ferroelectric PZT powder is between about 1 to about 1000 grams per liter of EPD liquid medium. In order to obtain efficient deposition of a smooth and uniform ferroelectric film, the commercial PZT powder is washed with a polar solvent, preferably, alcohol, more preferably, ethanol, thereby removing potential contaminants of the EPD process.

The polar solvent used as the EPD liquid medium may be pure, or mixes of two or more miscible, polar organic solvents such as alcohols, ketones, aldehydes, providing strong ionization effects to the particles. For simultaneously increasing the density and decreasing the porosity of the deposited ferroelectric green film, the preferred EPD liquid medium solvent is an alcohol. In the present invention, ethanol is preferably used as liquid medium solvent, due to the relatively higher dielectric constant and polarity of ethanol compared to other polar solvents, such as iso-propyl alcohol, acetone, and toluene. Moreover, electrostatic charge of the ferroelectric particles following the ultrasound treatment of step 5 below is proportional to the dielectric constant and polarity of the liquid medium solvent.

In step 5, there is addition of a low concentration, preferably less than 10 volume percent, more preferably less than 5 volume percent, yet more preferably less than 2 volume percent, yet more preferably less than 1 volume percent, yet more preferably less than 0.5 volume percent, yet more preferably less than 0.4 volume percent, yet more preferably less than 0.3 volume percent, yet more preferably less than 0.2 volume percent, and yet more preferably less than 0.1 volume percent, tri-functional phosphate ester additive to the EPD suspension of ferroelectric particles. A commercially available phosphate ester, of brand name Emphos PS 21A, manufactured by Witco Chemicals, USA, may be used as this unique tri-functional EPD suspension additive.

This is the critical step of improvement in the method of the present invention, implemented for stabilizing and controlling several suspension characteristics and properties during the electrophoretic migration stage, and for obtaining highly desirable dimensions, characteristics, and properties of the subsequently formed ferroelectric deposited green film during the deposition stage.

After addition of phosphate ester additive, one or more other solvent additives, such as acetylacetone, optionally, may be added to the EPD suspension, depending on desired characteristics and properties for the final application.

Following addition of the phosphate ester additive, and optional other additives, to the suspension, the suspension is subjected to an ultrasound treatment, at typical conditions of 20 kHz at a power level of 550 watts for a duration of about 4–10 minutes. This treatment further assures achieving a highly dispersed suspension of charged ferroelectric particles.

In step 6, the suspension of ferroelectric particles in ethanol having phosphate ester additive is transferred into an electrophoretic cell. The electrophoretic cell has in it a deposition electrode (the pattern to be coated or deposited onto), e.g., the cathode, and a counter electrode, e.g., the anode, featuring a specifically well defined shape.

In step 7, a direct current electric field is activated and passed through the suspension. EPD is preferably performed using constant current. The electric field strength in the range of between about 1 to about 50 volts/cm is established between the electrodes. The current density varies in the range of between about 0.1 to about 0.5 mA/cm$^2$. These EPD cell conditions enable tight control of film thickness and uniformity. Typical deposition duration is in the range of between about a few seconds to about a few minutes.

In step 8, there is removal of the green film, or deposited film from the suspension, followed by drying, for example, by air drying, and thermal processing, for example, by sintering, of the obtained ferroelectric film. Sintering is done by firing the EPD film, deposited film, at a temperature in the range between about 1000° C. to about 1300° C. for a period of about 0.5 to about 1.5 hours. Sintering of the film is preferably performed in a lead rich atmosphere. Step 8 is performed on the deposited film in both cases of forming a patterned or non-patterned coated product, or, a stand alone product.

In the case of an EPD film coated product, the substrate, patterned or non-patterned, and the EPD film that coats the substrate are together put into a, furnace. Following consolidation of the EPD film coating and the substrate, the combined entity functions as a piezoelectric product, device, or element.

In the case of a stand alone EPD film product, there is a need to separate the stand alone product from either a mandrel, or, a multi-component fixture used as a substrate during the deposition process. This separation process is accomplished using one of two procedures, (i) or (ii), respectively. In procedure (i), a mandrel of consumable material, for example, graphite, is used for step 1 of preparing the substrate. Once the mandrel with the EPD film coating are put into the furnace, the mandrel undergoes oxidation or evaporation, effecting elimination of the mandrel, thereby leaving the stand alone piezoelectric product, device, or element. In procedure (ii), a multi-component fixture, for example, featuring one component such as a disk, covered with a second component such as fibrous material, is specifically designed for temporarily holding a stand alone product during the deposition process, and is used for step 1 of preparing the substrate. Following the deposition process, the EPD film adhering to the second component covering material, together with the second component covering material are manually separated from the first component of the fixture, and together are put into a furnace. The second component covering material, for example, fibrous coating material, is thermally separated and eliminated from the EPD film, which now becomes the stand alone piezoelectric product, device, or element.

In step 9, there is electroding of the end terminals of the connectors that connect the deposited film substrate to the other part of the circuit. This can be done by any conventional metallizing technique, starting with hand brushing of a metal paste, and including, if desired, sputtering of a thin metal film on to the element. The specific method used for electroding is not critical, as long as it results in a metallic film extending from each side of the piezoelectric element, enabling the following polling step.

In step 10, there is polling of the obtained deposited film. A standard polarization, or polling, process is performed on the film by subjecting it to an electric field of appropriate magnitude accompanied by heating, for orienting the piezoelectric domains of the ferroelectric material in the desired direction.

Physical analysis of PZT deposited films was performed. Phase composition by XRD analysis of sintered PZT films repeatedly showed the presence of a single phase of PZT. SEM micrographs showed a microstructure of PZT grains in the size range of 2–4 microns. Electrical properties of a sintered PZT disk obtained by EPD such as dielectric constant, $\epsilon$, and resonance impedance, Np, were measured by depositing a top electrode of gold film of about 1 micron thick on top and bottom of the PZT sintered sample, followed by polarization of the film in an electric field, for example, of magnitude 2 kV/mm. The results were compared with PZT plates conventionally prepared by a uniaxial press method, and show that the EPD PZT samples exhibited values of electrical properties reported by the PZT powder manufacturer and, in some cases the results were better than for the pressed samples. The results are shown in Table 2, and further discussed below. The results of using the method of the present invention demonstrates a significant improvement in attaining high levels of piezoelectric properties and characteristics compared to the results obtained by using the above described EPD method of Sweeney and Whatmore involving nitric acid additive and nitrocellulose binder both included in EPD suspensions, as shown in FIG. 10 in the above Sweeney and Whatmore reference, where they attained levels of piezoelectric properties of only about 30% of what was reported by the PZT powder manufacturer.

Currently, the main function of using a low concentration additive is to enhance dispersing and stabilizing characteristics of an EPD suspension of ferroelectric particles via effecting pH, conductivity, and viscosity, of the EPD suspension, while preventing particle sedimentation, thereby improving the process of electrophoretic deposition, migration and deposition stages of the EPD process, ultimately leading to an improved piezoelectric element or device. Depending upon the electrochemistry of a specific additive, an additive may also perform a second function as a charging agent of the ferroelectric particles, thereby further enhancing particle migration during the migration stage of the electrophoretic process and formation of a deposited film having improved dielectric and piezoelectric properties. However, in the present invention, the phosphate ester additive, used in relatively low concentration of less than 1 volume percent of the suspension, performs these functions simultaneous to performing a third function of binding agent during the deposition stage of the EPD process. This exhibition of tri-functional behavior is not evidenced by using other currently known additives such as acetylacetone, nitric acid, or tartaric acid.

Addition of other liquid phase components or additives, for example, acetylacetone or tartaric acid, to the EPD ethanol/phosphate ester suspension of PZT particles is beneficial, but not necessary in order to achieve the unexpectedly improved results when using phosphate ester as the only additive. Only a relatively low concentration of phosphate ester needs to be added to the suspension, in order to efficiently disperse and charge the ferroelectric PZT particles, resulting in the suspension exhibiting an optimal range of conductivity of about 3–15 micro-S/cm and pH range of about 3–7. Furthermore, these optimal ranges of EPD suspension characteristics are maintained for different phosphate ester concentrations less than 1 volume percent.

Using a tri-functional phosphate ester additive enables producing a PZT green film featuring high density, high strength, and high uniformity, without the need for using a binder in the EPD suspension. Moreover, using a phosphate ester additive in the EPD suspension reduces time required for sintering, and shrinkage of, the deposited green film, leading to better control of dimensions during manufacture of a piezoelectric element or device. This tri-functional dispersing-charging-binding behavior is unique to the phosphate ester used as an EPD suspension additive.

It is well known that obtaining a high density and highly homogeneous green film microstructure depend primarily on the extent of dispersion of the starting ferroelectric powder raw material. Phosphate ester is a known additive used in tape casting operations, when the objective is to obtain thin planar tapes, primarily for manufacturing multi-layer capacitors based on using $BaTiO_3$ (BT) as the ferroelectric material. However, unlike typical applications of tape casting, electrophoretic deposition featured in the improved method of the present invention enables using sub-micron sized powders in order to overcome sedimentation problems associated with using large ferroelectric particles, requiring a minimal amount, for example, less than 10 volume percent, in contrast to typically about 30 volume percent, of the EPD liquid medium, of an organic additive for suspension stabilization and parametric control of the deposition process. In EPD of ferroelectric materials, in strong contrast to tape casting systems, the final product obtained is not necessarily a planar device having a specific pattern.

Examination of the chemical structure and selected physicochemical properties of the phosphate ester additive provides insight into the tri-functional behavior and mechanism of interaction of the phosphate ester additive and ferroelectric particles. Repulsive forces are increased by adsorbing polymer molecules on particle surfaces. The phosphate ester featured in the method of the present invention is obtained by reacting phosphoric acid with two different types of long-chained alcohols, each 10–15 carbon atoms long. Such a phosphate ester is readily soluble in pure ethanol and causes a decrease in the pH of the EPD liquid medium.

FIG. 1 illustrates the behavior of pure ethanol EPD liquid medium, as a plot of the variation in conductivity and pH of pure ethanol EPD liquid medium as a function of phosphate ester concentration. As seen in FIG. 1, addition of a small amount of phosphate ester additive to the EPD liquid medium causes a decrease in pH down to about pH 3, followed by a region of essentially constant pH independent of phosphate ester concentration. Addition of phosphate ester to the EPD liquid medium causes an increase in EPD liquid medium conductivity. Interestingly, and advantageous to the EPD process, in the region of essentially constant pH, further addition of the phosphate ester additive to the ethanol EPD liquid medium causes a continuous increase in the conductivity, but without further decrease in the pH, and therefore, no additional acidification of the EPD liquid medium. This effect supposedly occurs due to an increase in free protons, concurrent with an increase of ionic strength, in the EPD liquid medium by dissociation of the phosphate ester additive.

Figure 2:
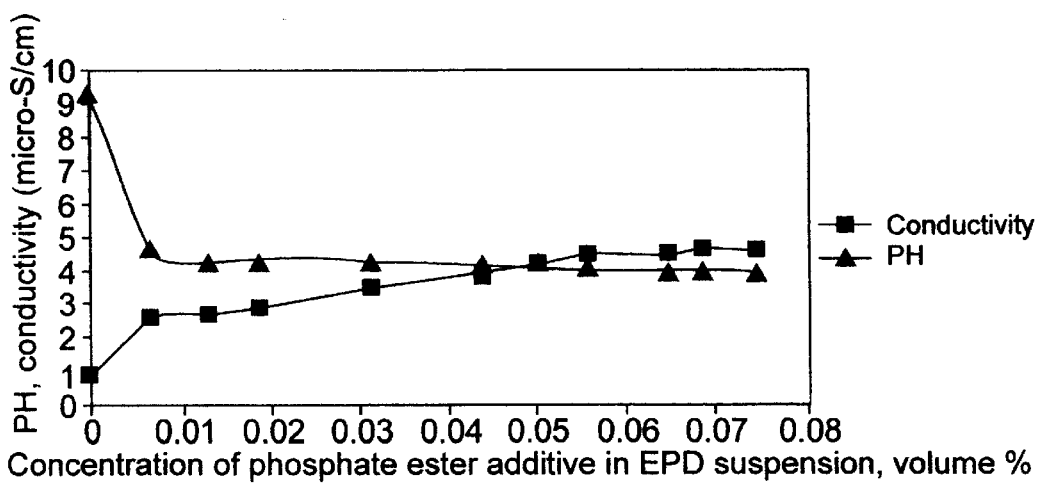
FIG. 2 is an illustration of a plot of the variation of conductivity and pH of the PZT EPD suspension, as a function of the phosphate ester additive concentration, for a PZT concentration of 50 grams/L in the suspension, in accordance with the present invention.

The same behavior of establishing a lower, but ultimately, constant pH, while causing a steady increase in conductivity of an EPD ferroelectric particle suspension, is observed when phosphate ester additive is introduced into an EPD suspension featuring low concentration PZT particles dispersed in pure ethanol EPD liquid medium. This behavior is illustrated in FIG. 2, which is a plot of the variation in conductivity and pH of the EPD PZT particle suspension as a function of phosphate ester additive concentration, for a PZT concentration of 50 grams/L in the EPD suspension. Addition of phosphate ester to the EPD suspension causes an increase in suspension conductivity. Again, advantageous to the EPD process, in the region of essentially constant pH, further addition of the phosphate ester additive to the EPD PZT particle suspension causes a continuous increase in the conductivity, but without further decrease in the pH, and therefore, no additional acidification of the EPD suspension. This effect due to the presence of the phosphate ester additive, is partly explained, by a proposed mechanism described below, whereby free protons released during dissociation of the phosphate ester in alcohol are adsorbed onto the surface of the ferroelectric PZT particles, causing an increase in the positive charge on the surface of the PZT particles, thus contributing to an increase in suspension conductivity.

The apparent buffering capacity of the phosphate ester additive illustrated in FIGS. 1 and 2 translates to more effective electrophoretic migration and deposition of the PZT particles, possibly by minimizing competitive electrochemical processes, or parasitic reactions, occurring on the cathode, such as the discharge of hydrogen.

Presence of the phosphate ester additive in an EPD suspension having ethanol as EPD liquid medium improves stabilization of the ferroelectric PZT particles. Most likely, stabilizing forces arising from the interaction between the phosphate ester additive and ethanol involve both electrostatic and steric interaction mechanisms. There is an increase in repulsive forces as a result of an increase in positive charges at the (solid)/(liquid), (ferroelectric particle surface)/(liquid) interface. A brief description of a possible mechanistic sequence of events taking place in the EPD suspension immediately prior to, and during, electrophoretic migration and deposition is provided here.

As mentioned above, the phosphate ester used as EPD additive in the present invention is a product of phosphoric acid and two different types of long chained alcohols. Phosphoric acid has three hydroxyl groups which can be converted into esters by replacing them with alkoxy groups. Once formed, there is a degree of dissociation and ionization of phosphate ester in a non-aqueous solvent and such a system would have freely mobile hydrogen ions in solution, as illustrated here:

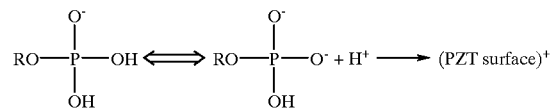

$H^+$ ions adsorb on to the PZT particle surface, whereas the anionic end of the amphipathic ionized phosphate ester specie is attracted to the positively charged particle surface, thereby increasing steric hindrance among the PZT particles, thus increasing stability of the suspension.

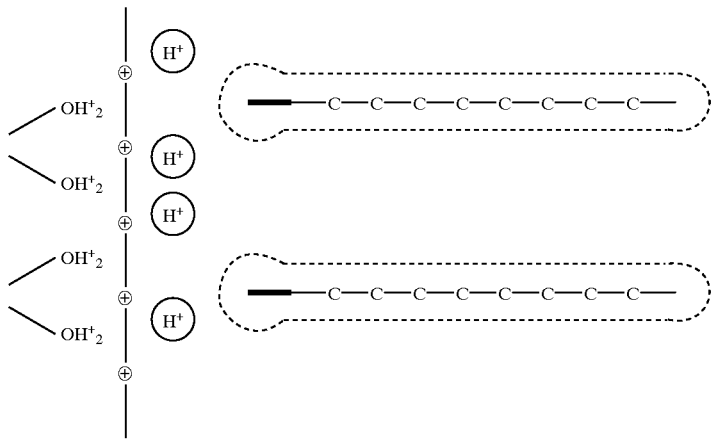

The suggested model of ferroelectric particle surface charging and stabilization by the phosphate ester is based on lyophobic-lyophilic reactions of amphipathic long chained hydrocarbon molecules (see scheme below). In this type of multi-component organic system, the anionic end of the amphipathic molecule is attracted to the positively charged particle surface by Coulombic electrostatic forces. The hydrocarbon lyophilic tail, being non polar, extends into the non-polar organic media. The tail is soluble in the bulk solution and, therefore, there is no attraction of other amphipathic molecules. The negative charge of the anionic end is small in comparison with positive surface charge and therefore it does not offset the positive charge. This positive charging of the ferroelectric particle surface, caused by the adsorption of ionized protons, is a probable driving factor for achieving high levels of dispersion, both by attracting the long chained phosphate esters, which provide the steric stability, as well as enabling a double layer electrostatic charging action of the particles.

Characteristics, dimensions, and properties of deposited PZT green films were determined as a function of phosphate ester additive concentration, in the range of 0.01 to 0.03 volume percent phosphate ester/EPD suspension, for PZT concentration of 1000 grams/L EPD suspension. The results shown in Table 1 are strongly indicative of improvement obtained in green film deposition.

TABLE 1

PZT green film dimensions and properties as a function of phosphate ester additive concentration, for a PZT concentration of 1000 grams/L of EPD suspension, for a 1 minute deposition duration.

| Concentration of Phosphate Ester Additive (% vol/vol) | Deposition Rate (mg/cm²) per 1 min | Film Thickness (microns) | Film Density (grams/cm³) | pH of EPD Suspension | Conductivity of EPD Suspension (micro-S/cm) |
|---|---|---|---|---|---|
| 0.01 | 0 | 0 | 0 | 8.19 | 3.4 |
| 0.02 | 46.5 | 92.3 | 5.0 | 6.75 | 3.5 |
| 0.03 | 199 | 397 | 5.02 | 6.54 | 4 |

Combining results shown in Table 1, with results shown in FIGS. 1 and 2, clearly confirms the tri-functional nature of the phosphate ester additive as a dispersing agent, a charging agent, in addition to functioning as a binder, which is in strong contrast to the results obtained when using other known prior art additives such as acetylacetone, nitric acid, or tartaric acid. Moreover, in the present invention, using tri-functional phosphate ester as additive precludes the need of using a separate binder in the EPD ferroelectric particle suspension, in contrast to that described by Sweeney and Whatmore, as discussed above.

Visual inspection and physical examination of coated elements, and different patterned substrates, featuring PZT deposited films obtained by using the improved EPD method of the present invention shows the excellent quality obtainable in manufacturing a diversity of piezoelectric products, devices, or elements, especially in comparison to products obtained by using methods involving other known effective EPD suspension additives such as acetylacetone or tartaric acid.

Figure 3A:
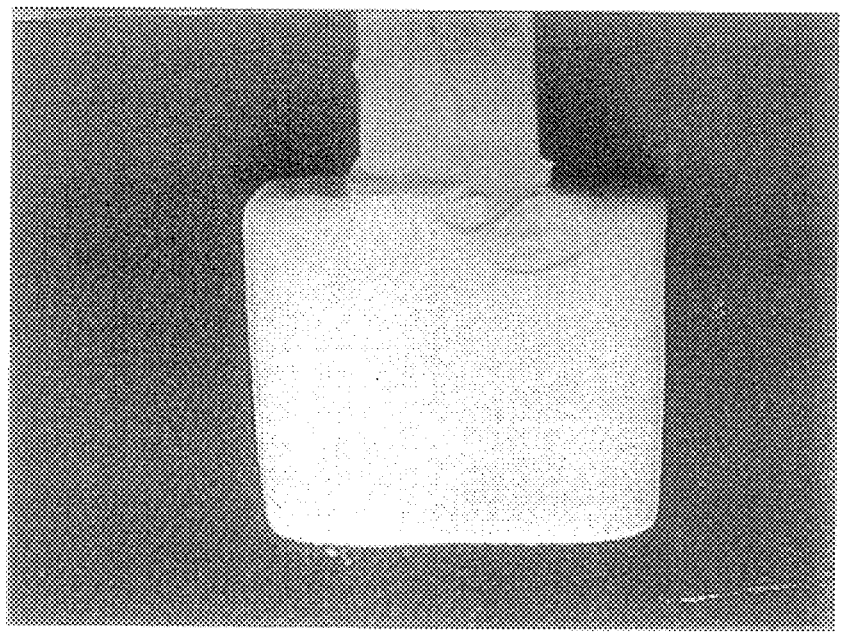
FIG. 3A is a photograph of an exemplary coating of a stainless steel substrate with PZT, in accordance with the present invention.
Figure 3B:
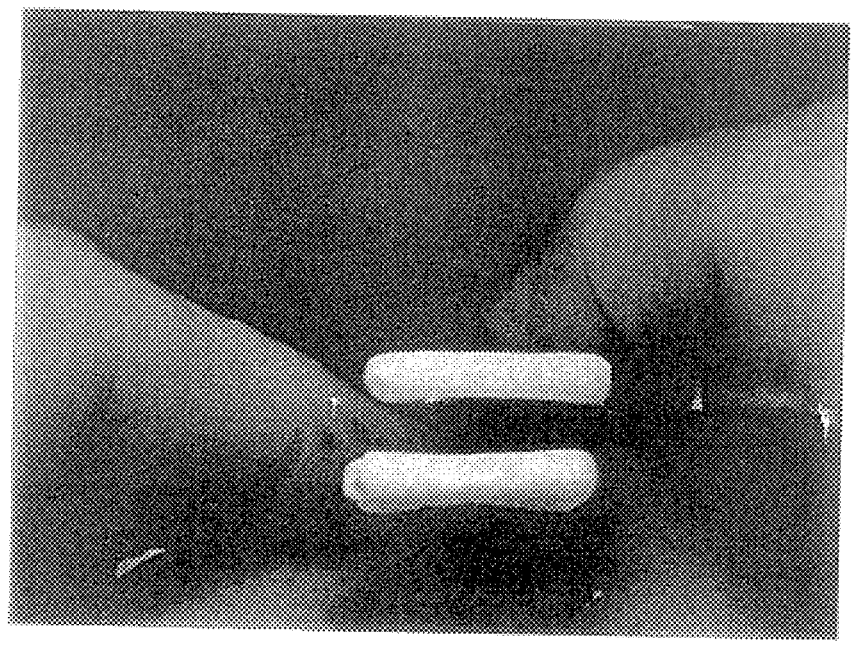
FIG. 3B is a photograph of a comparison of two exemplary coatings of PZT, formed by using the phosphate ester additive (top), in accordance with the present invention, or, by using acetylacetone additive (bottom), in the EPD suspension.
Figure 3C:
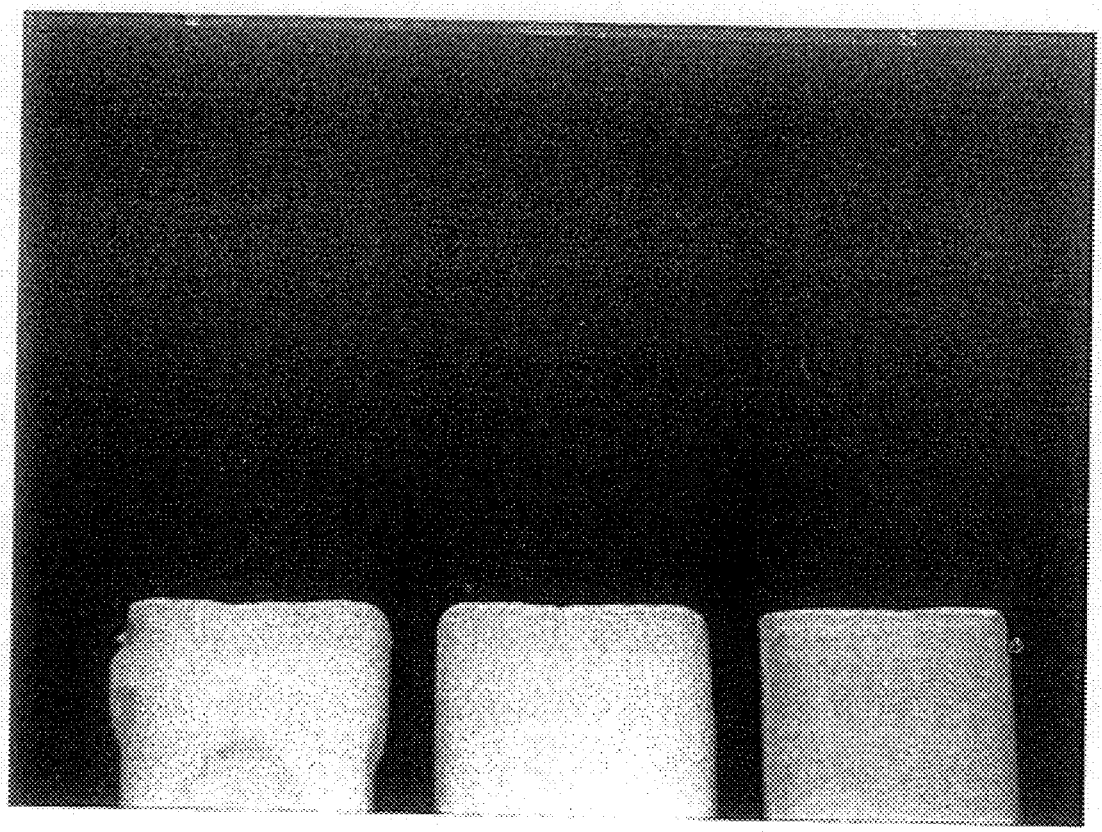
FIG. 3C is a photograph of a comparison of three exemplary coated samples of PZT, formed by using tartaric acid additive (left), phosphate ester additive (middle), or acetylacetone additive (right), in the EPD suspension.

Exemplary PZT coated elements, formed by employing the same EPD method except for differences related to using a different additive in the EPD suspension, are shown in FIGS. 3A through 3C. FIG. 3A is a photograph of an exemplary PZT deposited coating formed by using the phosphate ester additive in the EPD suspension. FIG. 3B is a photograph of a comparison of two exemplary PZT deposited coatings, formed by using the phosphate ester additive (top), or, by using acetylacetone additive (bottom), in the EPD suspension. FIG. 3C is a photograph of a comparison of three exemplary PZT deposited coatings, formed by using tartaric acid additive (left), phosphate ester additive (middle), or, acetylacetone additive (right), in the EPD suspension. These figures clearly demonstrate that PZT coatings using phosphate ester additive are sharper with highly distinct boundaries, smoother, and, upon measurement, also denser, than PZT coatings formed with using another additive in the EPD suspension.

Figure 5:
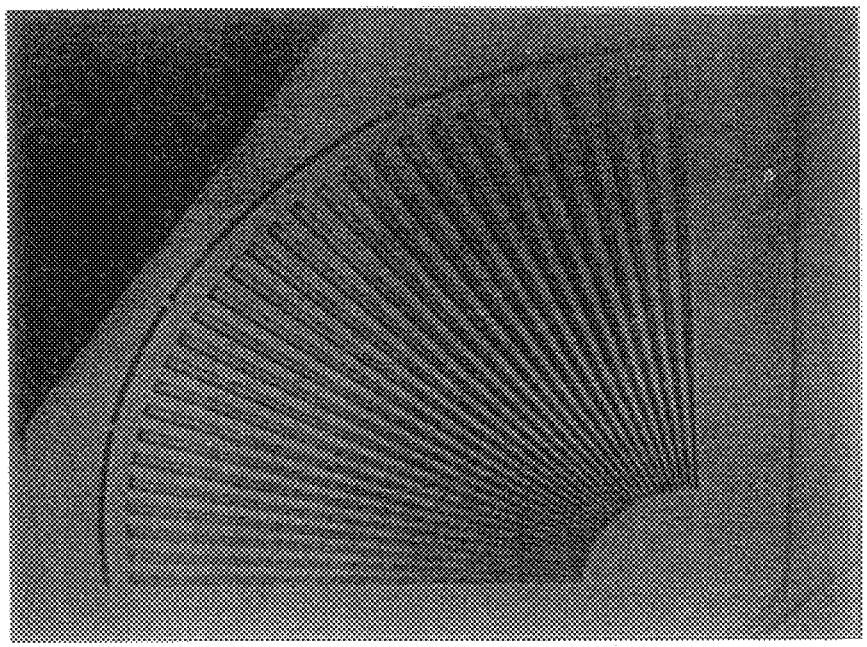
FIG. 5 is a micrograph of a fan shaped pattern of an alumina substrate coated with PZT, obtained by using the tri-functional phosphate ester additive, in accordance with the present invention.
Figure 6:
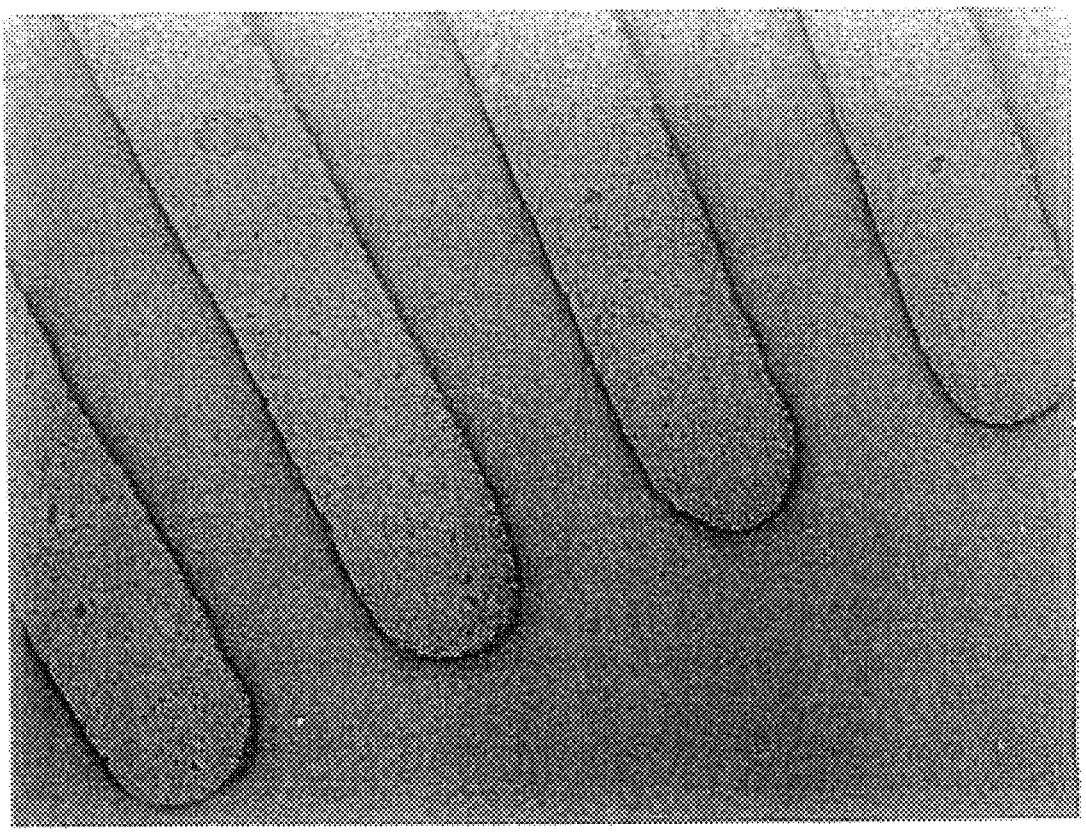
FIG. 6 is a micrograph of fan edges of a fan shaped pattern coated with PZT, obtained by using the tri-functional phosphate ester additive, in accordance with the present invention.

EPD including the use of phosphate ester additive enables achieving PZT coated patterns with exceptionally high green film uniformity, depth or thickness distribution, and reproducibility to within ±2 microns for 20 microns film thickness. This is illustrated in FIGS. 4–6, where FIG. 4 is a micrograph of a conducting lines pattern coated with PZT, FIG. 5 is a micrograph of a fan shaped pattern of an alumina substrate coated with PZT, and FIG. 6 is a micrograph of fan edges of a fan shaped pattern coated with PZT, respectively, where each pattern is obtained by using the tri-functional phosphate ester additive, in accordance with the present invention.

Figure 7:
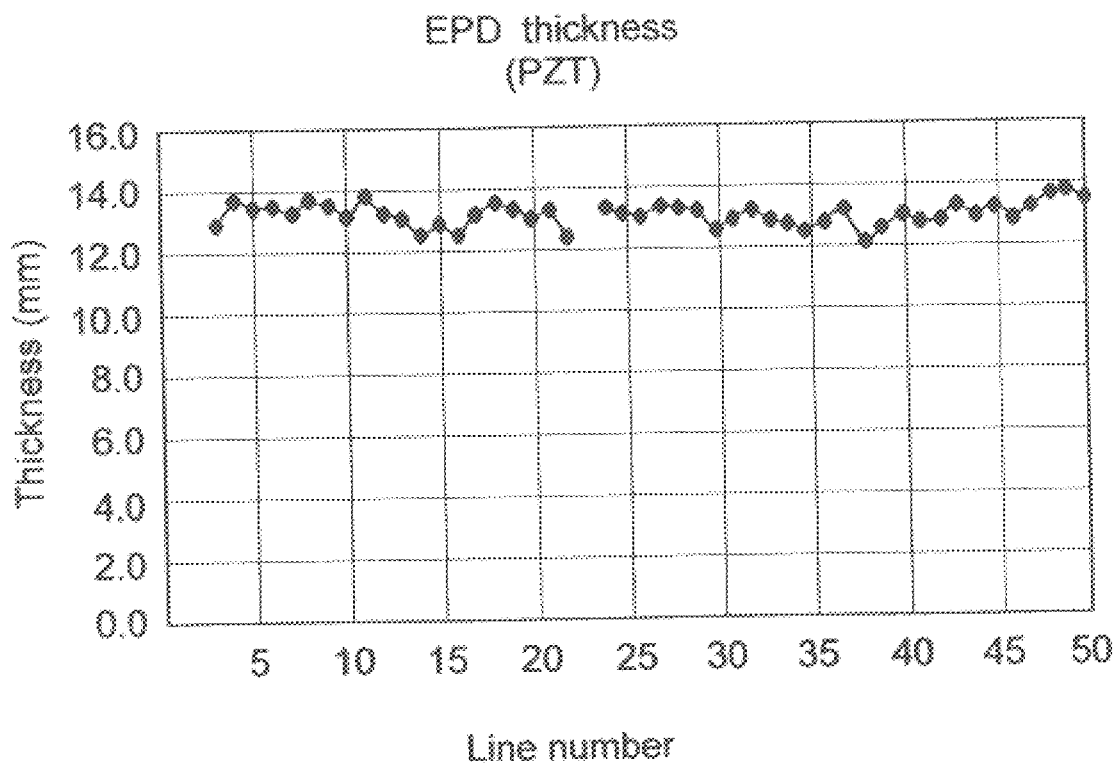
FIG. 7 is, a graph showing a plot of PZT green film thickness as a function of PZT coated conducting line number, obtained by using the tri-functional phosphate ester additive, in accordance with the present invention.
Figure 8:
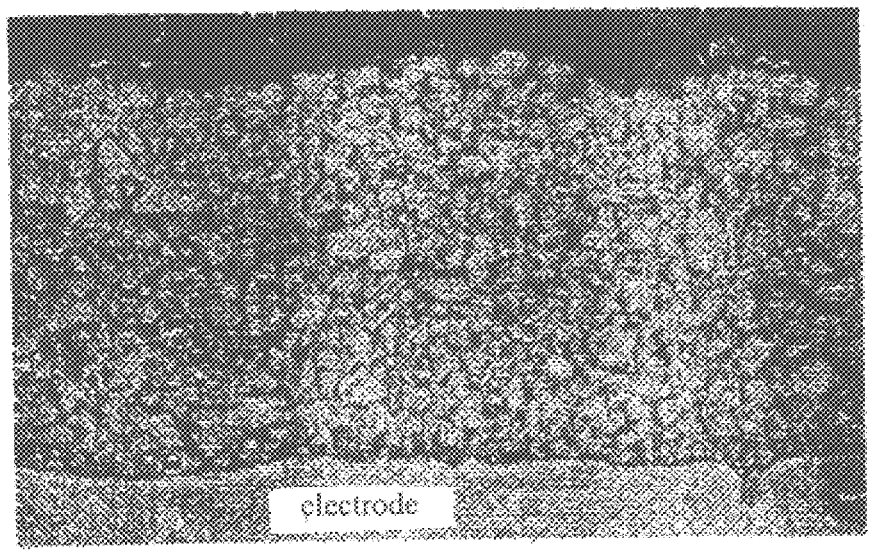
FIG. 8 is a micrograph of a cross section of one of the PZT coated conducting lines of the pattern shown in FIG. 4, obtained by using the tri-functional phosphate ester additive, in accordance with the present invention.

Reproducibility of the improved method is further illustrated in FIGS. 7 and 8, where FIG. 7 is a graph showing a plot of PZT green film thickness as a function of PZT coated conducting line number, obtained by using the tri-functional phosphate ester additive. The results shown in the plot of FIG. 7 are representative of the conducting lines pattern coated with PZT shown in FIG. 4. Using the phosphate ester additive enabled achieving high reproducibility, for example, to within ±2 microns, of a series of many electrodes, each coated with a PZT film, for a distance between two conductivity lines of about 20 microns.

Figure 4:
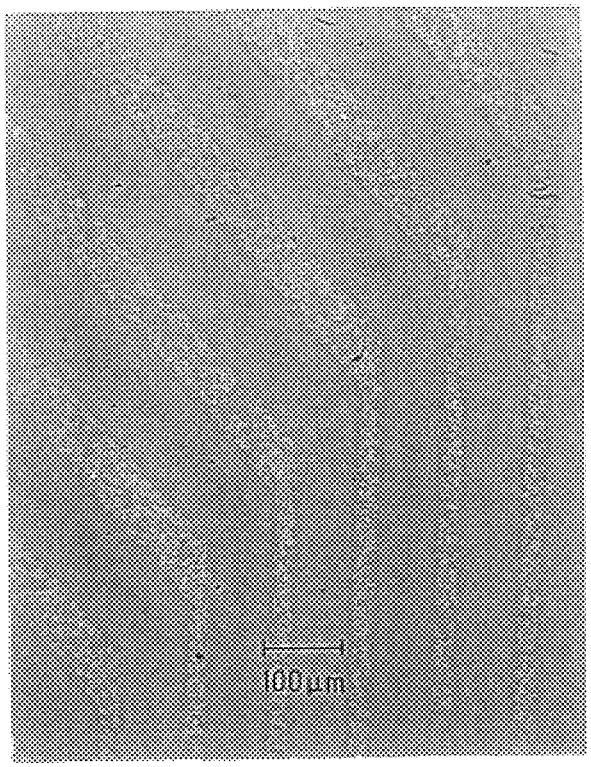
FIG. 4 is a micrograph of a conducting lines pattern coated with PZT, obtained by using the tri-functional phosphate ester additive, in accordance with the present invention.

FIG. 8 is a micrograph of a cross section view of one of the PZT coated conducting lines of the pattern shown in FIG. 4, wherein, consistent with the results shown in FIG. 7, only very slight variation in PZT film thickness is noticeable at the top of the PZT conducting line coating.

To further show the significant improvement obtained by including tri-functional phosphate ester additive in the EPD suspension for performing EPD of ferroelectric films, a comparison of measured film electrical properties is made between cold pressed PZT disks formed by cold pressing PZT pellets according to a conventional uniaxial press method, and EPD PZT disks prepared according to the improved method of the present invention. The same source and type of PZT powder was used in all methods. PZT disks formed by cold pressing PZT pellets contained no phosphate ester additive. Dimensions of the cold pressed disks and the EPD free standing disks were about the same. Dielectric and piezoelectric properties of PZT disks prepared by the two methods are compared in Table 2 below.

In Table 2, $\epsilon$, tan $\delta$, $k_p$, and $N_p$, represent dielectric constant, lost tangent, coupling coefficient (a), and resonance impedance, respectively, and, EPD (750) and EPD (1000) refer to different concentrations of EPD suspensions from which the PZT disks were made. EPD formed PZT disks generally result in having higher values of $\epsilon$, dielectric constant, both before and after poling, compared to values for cold pressed pellets, and values of resonance impedance, $N_p$, are slightly lower for EPD formed PZT disks compared to cold pressed disks.

Based, in part, on these comparative results, EPD formed PZT films are significantly more effective for manufacturing high quality piezoelectric devices or free standing objects.

TABLE 2

Comparison of dielectric and piezoelectric properties of EPD PZT disks and cold pressed PZT pellets.

| | Before Poling | | After Poling | | | |
|---|---|---|---|---|---|---|
| Sample | $\epsilon$ | Tan$\delta$ | $\epsilon$ | Tan$\delta$ | $K_p$ | $N_p$ (kHz · mm) |
| Cold Pressed | 1330 ± 10 | 0.019 | 1500–1600 | 0.019 | 0.575–0.59 | 2010 ± 10 |
| EPD (750) | 1390 | 0.019 | 1660 | 0.018 | 0.535–0.56 | 1800–1970 |
| EPD (1000) | 1300–1430 | 0.020 | 1460–1600 | 0.019 | 0.45–0.57 | 1600–1800 |

Additional objects, advantages, and novel features of the present invention will become apparent to one ordinarily skilled in the art upon examination of the following examples, which are not intended to be limiting. Additionally, each of the various embodiments and aspects of the present invention as delineated herein above and as claimed in the claims section below finds experimental support in the following examples.

EXAMPLES

Reference is now made to the following examples, which together with the above descriptions, illustrate the invention in a non-limiting fashion.

Example 1

PZT Thick Film

An EPD suspension was prepared by dispersing 5 g of commercial ceramic lead-zirconate-titanate, PZT, powder in 100 ml of ethyl alcohol. Average PZT particle size was 0.53 micron. For reducing conductivity of the suspension, the powder was washed in ethyl alcohol until obtaining a conductivity of 1 micro-S/cm.

Sufficient phosphate ester additive was added to the suspension, until the pH steadied between about 3–4, and the range of conductivity was 10–12 micro-S/cm. No other additive was added to the suspension. The suspension was subjected to an ultrasound treatment for about 4 minutes with cooling.

Platinum foil was used as anode, and an alumina substrate with selectively deposited electrodes, serving as the cathode, were immersed into the suspension. A constant direct current having current density of 0.1–0.4 mA/cm$^2$ was passed through the suspension. During 0.5 minute of film deposition, field strength varied in the range of 10 to 30 volts/cm.

The obtained PZT film was about 20 microns thick. After deposition, the deposited film was dried. The green density of the PZT film was about 60% of theoretical.

Example 2

Piezoelectric device—PZT coated pattern of conducting lines

An EPD suspension was prepared by dispersing 50 g of commercial ceramic lead-zirconate-titanate, PZT, powder in 100 ml of ethyl alcohol. PZT average particle size was 0.53 micron. For reducing conductivity of the suspension, the powder was washed in ethyl alcohol until obtaining a conductivity of 1 micro-S/cm.

Phosphate ester additive was added to the suspension up to a quantity of about 0.1 ml for a concentration of about 0.1 volume %, until the pH steadied between about 3–4, and the conductivity was about 6 micro-S/cm. No other additive was added to the suspension. The suspension was subjected to an ultrasound treatment for about 4 minutes with cooling.

Platinum foil was used as anode, and an alumina substrate featuring a special pattern of conducting lines positioned in alternating line spaces, serving as the cathode, were immersed into the suspension. A constant direct current having current density of 0.001 amp/cm$^2$ was passed through the suspension. During 30 seconds of film deposition, field strength varied from 0.1 to 30 volts/cm.

The obtained PZT film was about 20–30 microns thick. After deposition, the deposited film was sintered at 1200° C. for 0.5 hr. Procedure and results of this example provide the basis for the preceding discussion relating to FIGS. 3 and 6.

Example 3

PZT Disk

An EPD suspension was prepared by dispersing 50 g of commercial ceramic lead-zirconate-titanate (PZT) powder in ml of ethyl alcohol. PZT average particle size was 0.53 micron. For reducing conductivity of the suspension, the powder was washed in ethyl alcohol until obtaining a conductivity of 1 micro-S/cm of the suspension.

Phosphate ester additive was added to the suspension up to a quantity of about 0.01 ml for a concentration of about 0.01 volume %, until the pH steadied at about 3.5, and the range of conductivity was 10–12 micro-S/cm. Acetylacetone, 0.5 ml for a concentration of 0.5 volume %, was also added to the suspension. The suspension was subjected to an ultrasound treatment for about 4 minutes with cooling.

Platinum foil was used as anode, and stainless steel substrate with special fibrous coating, serving as the cathode, were immersed into the suspension. A constant direct current having current density of 0.4–0.5 mA/cm$^2$ was passed through the suspension. During 4 minutes of disk deposition, field strength varied from 30 to 50 volts/cm.

The obtained PZT disk was about 2 mm thick. After deposition, the deposited disk was easily removed with the fibrous coating and dried. The green density of the PZT disk was about 70% of theoretical. Sintering of the disk was performed at 1250° C. for 1 hr.

Phase composition of the sintered PZT disk was determined by XRD analysis, and showed the presence of a single PZT phase. SEM micrographs of the PZT disk cross section showed a microstructure having PZT grains of 2–4 microns in size. Electrical properties of the sintered disk were measured by depositing top and bottom electrodes of gold film of about 1 micron thick, followed by polarization of the disk in a 2 kV/mm field. The results were compared with cold pressed PZT pellets, having the same dimensions as the EPD disks.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. An improvement to a method of depositing ferroelectric particles on a surface of a substrate for manufacturing a coating film or a stand-alone product, featuring the steps of:
   (a) preparing a suspension of the ferroelectric particles; and
   (b) electrophoretically depositing the ferroelectric particles on a surface of the substrate, for forming a green film on the surface of the substrate, the improvement comprising the step of:
   (c) during the step of preparing the suspension of the ferroelectric particles, adding to the suspension a phosphate ester additive having a concentration less than 10 volume percent in the suspension.

2. The method of claim 1, wherein said concentration of said phosphate ester additive is selected from the group consisting of less than seven volume percent, less than three volume percent, and less than one volume percent, in the suspension.

3. The method of claim 1, wherein said phosphate ester additive functions as a dispersing agent, an electrostatic charging agent, and a binding agent in the suspension of the ferroelectric particles.

4. The method of claim 1, wherein said phosphate ester additive is obtained by reacting phosphoric acid with two different long-chained alcohols, each of said two different long-chained alcohols being 10–15 carbon atoms long.

5. The method of claim 1, wherein said phosphate ester additive is soluble in a polar solvent.

6. The method of claim 1, whereby addition of said phosphate ester additive to the suspension of the ferroelectric particles causes a decrease in pH of the suspension.

7. The method of claim 1, whereby addition of said phosphate ester additive to the suspension of the ferroelectric particles causes an increase in conductivity of the suspension of the ferroelectric particles.

8. The method of claim 1, whereby addition of said phosphate ester additive to the suspension of the ferroelectric particles causes a decrease in pH of the suspension and an increase in conductivity of the suspension.

9. The method of claim 1, whereby for addition of said phosphate ester additive to the suspension of the ferroelectric particles above an empirically determined concentration of said phosphate ester additive in the suspension, pH of the suspension remains approximately constant.

10. The method of claim 1, whereby for addition of said phosphate ester additive to the suspension of the ferroelectric particles above an empirically determined concentration of said phosphate ester additive in the suspension, pH of the suspension remains approximately constant and conductivity of the suspension increases.

11. A method of depositing ferroelectric particles on a surface of a substrate for manufacturing a coating film or a stand-alone product, the method comprising the steps of:
   (a) preparing a suspension of the ferroelectric particles, said suspension of the ferroelectric particles including a phosphate ester additive having a concentration less than 10 volume percent in said suspension; and
   (b) electrophoretically depositing the ferroelectric particles on the surface of the substrate, for forming a green film on the surface of the substrate.

12. The method of claim 11, wherein said concentration of said phosphate ester additive is selected from the group consisting of less than seven volume percent, less than three volume percent, and less than one volume percent, in said suspension.

13. The method of claim 11, wherein said phosphate ester additive functions as a dispersing agent, an electrostatic charging agent, and a binding agent in said suspension of the ferroelectric particles.

14. The method of claim 11, wherein said phosphate ester additive is obtained by reacting phosphoric acid with two different long-chained alcohols, each of said two different long-chained alcohols being 10–15 carbon atoms long.

15. The method of claim 11, wherein said phosphate ester additive is soluble in a polar solvent, said polar solvent includes an alcohol, said alcohol includes ethanol.

16. The method of claim 11, whereby addition of said phosphate ester additive to said suspension of the ferroelectric particles causes a decrease in pH of said suspension.

17. The method of claim 11, whereby addition of said phosphate ester additive to said suspension of the ferroelectric particles causes an increase in conductivity of said suspension.

18. The method of claim 11, whereby addition of said phosphate ester additive to said suspension of the ferroelectric particles causes a decrease in pH of said suspension and an increase in conductivity of said suspension.

19. The method of claim 11, whereby for addition of said phosphate ester additive to said suspension of the ferroelectric particles above an empirically determined concentration of said phosphate ester additive in said suspension, pH of said suspension remains approximately constant.

20. The method of claim 11, whereby for addition of said phosphate ester additive to said suspension of the ferroelectric particles above an empirically determined concentration of said phosphate ester additive in said suspension, pH of said suspension remains approximately constant and conductivity of said suspension increases.

21. The method of claim 11, wherein said green film on the surface of the substrate is selected from the group consisting of stand alone product, patterned coating, and non-patterned coating.

22. The method of claim 11, wherein said green film has a thickness uniformity to within about ±2 microns.

23. The method of claim 11, further comprising the steps of:
   (c) preparing the surface of the substrate for electrophoretic deposition of the ferroelectric particles according to manufacturing a piezoelectric product selected from the group consisting of stand alone, pattern coated, and non-pattern coated; and
   (d) thermally processing said green film on the surface of the substrate according to said green film selected from the group consisting of said stand alone product and said coated product.

24. The method of claim 23, wherein the step of thermally processing said green film according to said stand alone product, said green film formed on the surface of the substrate featuring a mandrel for holding said green film, further comprises the step of:
   (i) heating and separating said green film from the surface of said mandrel featuring a consumable material, thereby forming said stand alone product.

25. The method of claim 23, wherein the step of thermally processing said green film according to said stand alone product, said green film formed on the surface of the substrate featuring a multi-component fixture for holding said green film, further comprises the steps of:
   (i) separating said green film held by a second component of said multi-component fixture from a first component of said multi-component fixture, said second component featuring a consumable material; and
   (ii) heating and separating said separated green film from the surface of said second component, thereby forming said stand-alone product.

* * * * *